(12) United States Patent
Suo et al.

(10) Patent No.: US 11,373,803 B2
(45) Date of Patent: Jun. 28, 2022

(54) METHOD OF FORMING A MAGNETIC CORE ON A SUBSTRATE

(71) Applicant: APPLIED MATERIALS, INC., Santa Clara, CA (US)

(72) Inventors: Peng Suo, Singapore (SG); Yu Gu, Singapore (SG); Guan Huei See, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 704 days.

(21) Appl. No.: 16/056,847

(22) Filed: Aug. 7, 2018

(65) Prior Publication Data
US 2019/0051454 A1 Feb. 14, 2019

Related U.S. Application Data

(60) Provisional application No. 62/544,744, filed on Aug. 11, 2017.

(51) Int. Cl.
*H01F 7/06* (2006.01)
*H01F 41/04* (2006.01)
(Continued)

(52) U.S. Cl.
CPC ....... *H01F 41/041* (2013.01); *H01F 17/0013* (2013.01); *H01F 27/2804* (2013.01); *H01F 41/046* (2013.01); *H01L 21/486* (2013.01); *H01L 21/4857* (2013.01); *H01L 23/49822* (2013.01); *H01L 23/49838* (2013.01); *H01L 28/10* (2013.01); *H01F 41/04* (2013.01);
(Continued)

(58) Field of Classification Search
CPC .. H01F 41/041; H01F 41/046; H01F 17/0013; H01F 27/2804; H01F 2017/0066; H01F 2027/2809; H01L 23/49822; H01L 23/49838; H01L 28/10; H01L 21/4846; H01L 21/4857; H01L 21/486
See application file for complete search history.

(56) References Cited

U.S. PATENT DOCUMENTS 5,239,744 A * 8/1993 Fleming ................... B28B 1/48
264/272.15
5,917,244 A * 6/1999 Lee ....................... H01L 21/288
257/762
(Continued)

FOREIGN PATENT DOCUMENTS

JP 2011140106 A * 7/2011 ......... B81C 99/0085

OTHER PUBLICATIONS

Max K. C. Wu et al., "UFI (UBM-Free Integration) Fan-In WLCSP Technology Enables Large Die Fine Pitch Packages". 2016 IEEE 66th Electronic Components and Technology Conference (ECTC).
(Continued)

*Primary Examiner* — Paul D Kim
(74) *Attorney, Agent, or Firm* — Moser Taboada

(57) ABSTRACT

A method of forming a magnetic core on a substrate having a stacked inductor coil includes etching a plurality of polymer layers to form at least one feature through the plurality of polymer layers, wherein the at least one feature is disposed within a central region of a stacked inductor coil formed on the substrate; and depositing a magnetic material within the at least one feature.

17 Claims, 11 Drawing Sheets

(51) Int. Cl.
   *H01F 17/00* (2006.01)
   *H01F 27/28* (2006.01)
   *H01L 21/48* (2006.01)
   *H01L 23/498* (2006.01)
   *H01L 49/02* (2006.01)

(52) U.S. Cl.
   CPC ........... *H01F 2017/0066* (2013.01); *H01F 2027/2809* (2013.01)

(56) References Cited

U.S. PATENT DOCUMENTS

| | | | |
|---|---|---|---|
| 6,114,937 A | 9/2000 | Burghartz et al. | |
| 6,387,819 B1* | 5/2002 | Yu | H01L 21/31138 216/41 |
| 8,513,771 B2 | 8/2013 | Elian et al. | |
| 9,129,940 B2 | 9/2015 | Hsieh et al. | |
| 9,190,389 B2* | 11/2015 | Meyer-Berg | H01L 23/49861 |
| 9,530,674 B2* | 12/2016 | Yieh | C23C 16/45544 |
| 9,786,424 B2* | 10/2017 | Park | H01F 17/0013 |
| 10,157,705 B2* | 12/2018 | Fukushima | H01F 17/0013 |
| 10,734,331 B2* | 8/2020 | Male | H01F 27/2804 |
| 2012/0056705 A1* | 3/2012 | Kim | H01F 17/0033 336/200 |
| 2013/0234820 A1* | 9/2013 | Yoo | H01F 41/046 336/200 |
| 2016/0133565 A1* | 5/2016 | Bhatkar | H01F 1/14 257/531 |

OTHER PUBLICATIONS

Chung-Hao Tsai et al., "High Performance Passive Devices for Millimeter Wave System Integration on Integrated Fan-Out (InFO) Wafer Level Packaging Technology". 2015 IEEE International Electron Devices Meeting (IEDM).

Yang Zheng et al., "Flexible MEMS Inductors Based on Parylene-FeNi Compound Substrate for Wireless Power Transmission System". 2013 8th Annual IEEE International Conference on Nano/Micro Engineered and Molecular Systems.

* cited by examiner

METHOD OF FORMING A MAGNETIC CORE ON A SUBSTRATE

CROSS-REFERENCE TO RELATED APPLICATIONS

This application claims benefit of U.S. provisional patent application Ser. No. 62/544,744, filed Aug. 11, 2017, which is herein incorporated by reference.

FIELD

Embodiments of the present disclosure generally relate to methods of processing substrates and substrates fabricated according to such methods. Specifically, embodiments of the present disclosure relate to substrates having an inductor with a metal core.

BACKGROUND

In the fabrication of modern electronic devices, the increasing device density and decreasing device dimensions demand more stringent requirements in the packaging or interconnecting techniques of such high density devices. Generally, the fabrication of modern electronics involves wafer level packaging. Wafer level packaging may include fan-in and fan-out techniques of creating an inductor for providing internal and external device connectivity such as, for example, wireless charging and chip-to-chip communication. Creating the inductors typically involves the use of a polymer material having dielectric properties and an inductor disposed within the polymer material. However, the inventors have observed that the inductance and quality factor (i.e., ratio of inductance to porosity resistance) of current inductors does not satisfactorily meet current quality demands.

Thus, the inventors have developed improved techniques to fabricate a semiconductor inductor.

SUMMARY

Embodiments of methods for creating an inductor having a magnetic core on a substrate are provided herein. In some embodiments, a method of forming a magnetic core on a substrate having a stacked inductor coil includes etching a plurality of polymer layers to form at least one feature through the plurality of polymer layers, wherein the at least one feature is disposed within a central region of a stacked inductor coil formed on the substrate; and depositing a magnetic material within the at least one feature.

In some embodiments, a method of forming a magnetic core on a substrate for a packaging application, includes forming a stacked spiral inductor coil atop the substrate, wherein the stacked spiral inductor coil is disposed within a plurality of polymer layers; forming a first photoresist atop an uppermost polymer layer; etching a plurality of exposed portions of the uppermost polymer layer through the first photoresist to form a plurality of vias through the plurality of polymer layers; removing the first photoresist; forming a second photoresist atop the uppermost polymer layer; depositing a magnetic material within the plurality of vias through the second photoresist; and removing the second photoresist.

In some embodiments, a substrate for a packaging application includes a plurality of polymer layers disposed atop a substrate base; a stacked spiral inductor coil disposed within the plurality of polymer layers; and at least one magnetic core disposed through the plurality of polymer layers and within a central region defined by innermost windings of the stacked spiral inductor coil.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
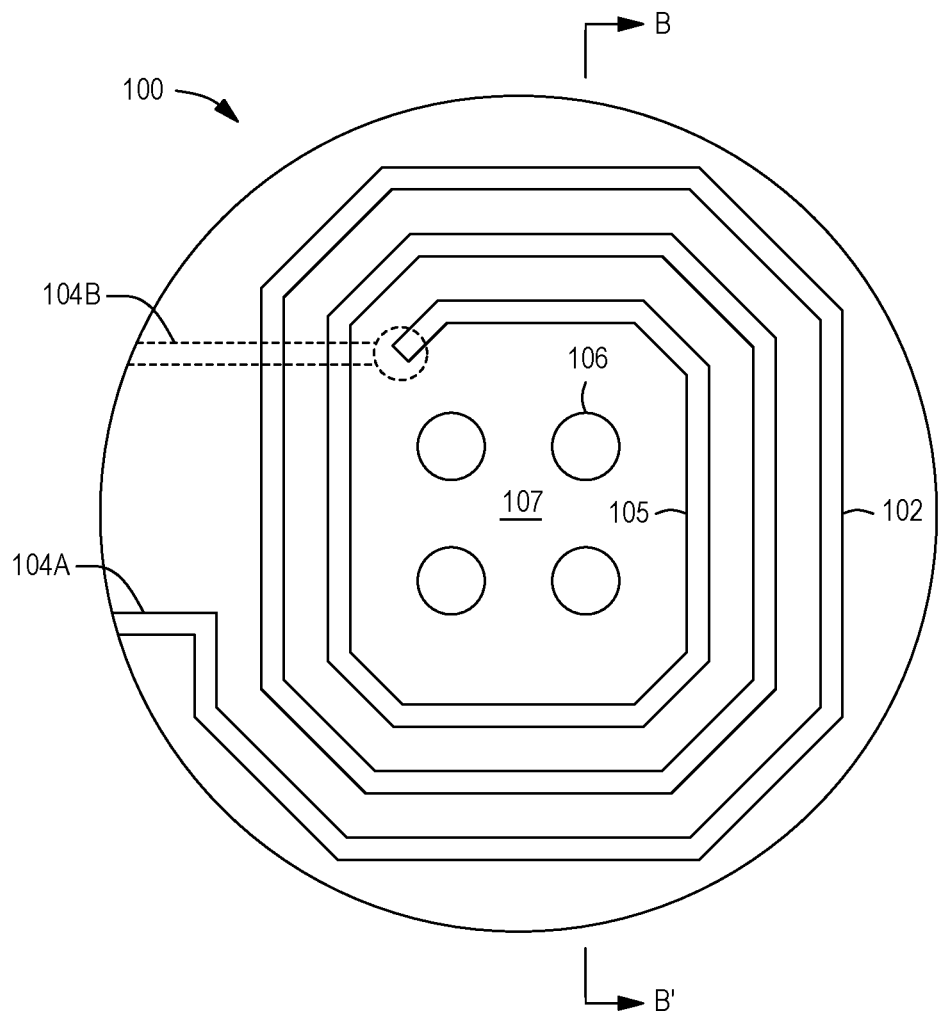
FIG. 1A depicts a schematic top view of a substrate for a packaging application in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods for forming a magnetic core on a substrate for a packaging application are provided herein. The methods described herein advantageously provide the creation, on a substrate, of at least one magnetic core disposed within a central region defined by an inductor disposed within a plurality of polymer layers atop the substrate. The magnetic cores as disclosed herein advantageously provide improved inductance and quality factor (i.e., ratio of inductance to porosity resistance). Thus, the methods described herein may advantageously be utilized in advanced fan-in or fan-out wafer level packaging. The inventive inductor having a magnetic core may advantageously improve wireless charging and chip-to-chip communication of electronic devices incorporating the inventive inductor having a magnetic core.

Figure 1B:
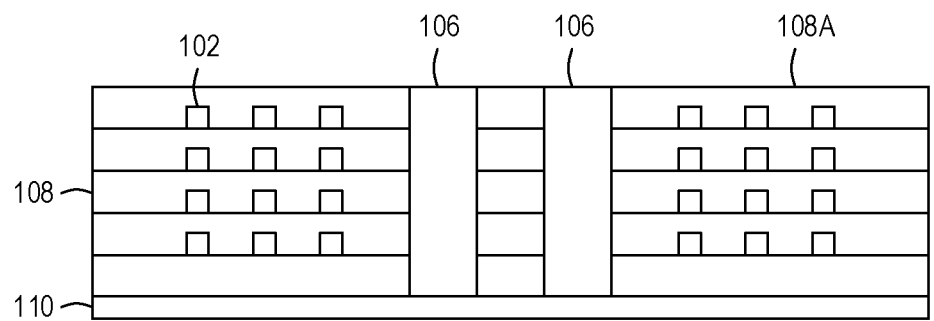
FIG. 1B depicts schematic cross-section of the substrate illustrated in FIG. 1 taken along line B-B'.
Figure 6A:
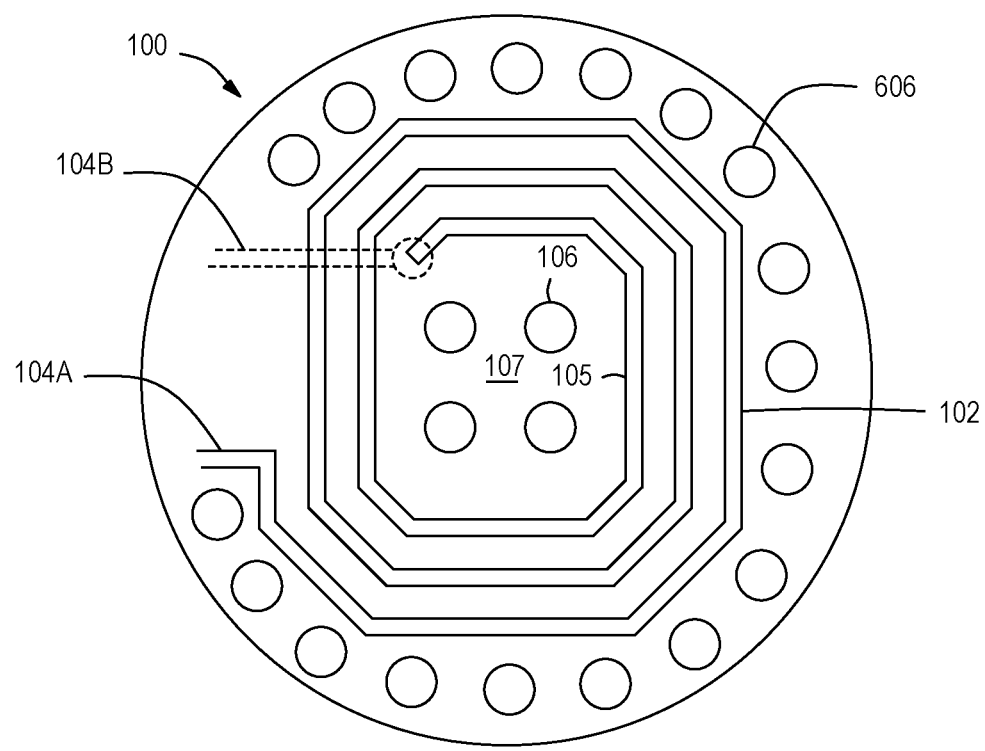
FIG. 6A depicts a schematic top view of a substrate for a packaging application in accordance with at least some embodiments of the present disclosure.
Figure 6B:
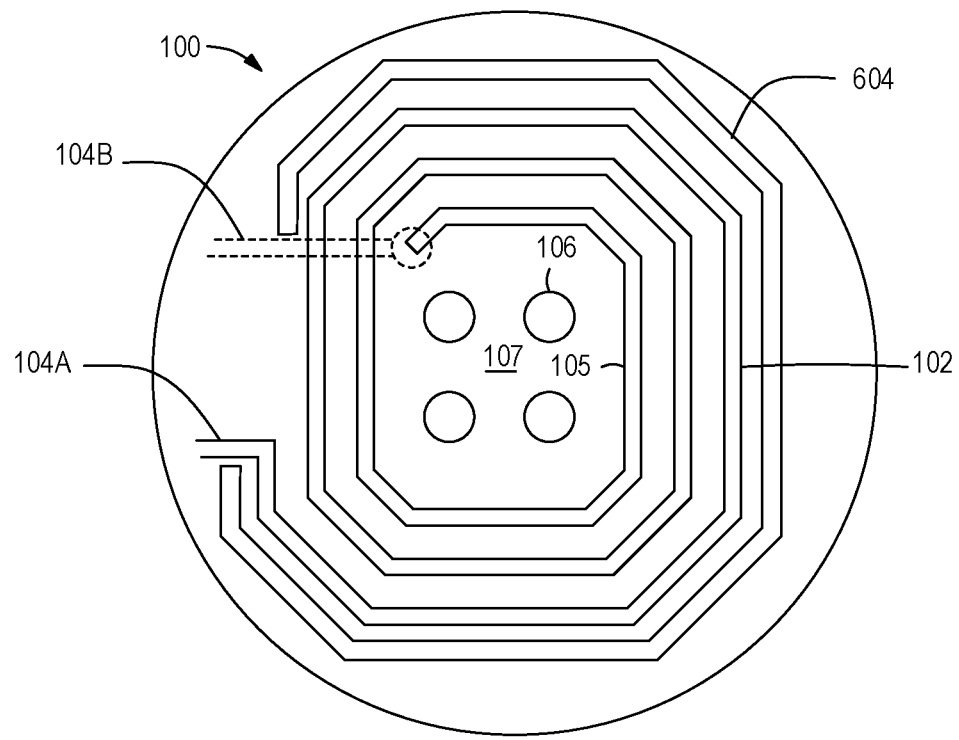
FIG. 6B depicts a schematic top view of a substrate for a packaging application in accordance with at least some embodiments of the present disclosure.

FIG. 1A depicts a schematic top view of a substrate 100 for a packaging application having a plurality of polymer layers and an inductor disposed within the plurality of polymer layers in accordance with at least some embodiments of the present disclosure. FIG. 1B is a schematic cross-sectional view of the substrate 100 taken along line B-B'. In some embodiments, the substrate 100 includes a plurality of polymer layers 108, a stacked inductor coil (e.g., stacked spiral inductor coil 102) disposed within the plurality of polymer layers 108, and one or more magnetic cores 106 (four shown in FIG. 1A) disposed through the plurality of polymer layers 108 within a central region 107 defined by innermost windings 105 of the stacked spiral inductor coil 102. Although four magnetic cores 106 are shown in FIG. 1A, the substrate 100 may have one or more magnetic cores 106. In some embodiments, the substrate 100 includes a plurality of magnetic cores 106. In some embodiments, as shown in FIG. 6A, a plurality of magnetic cores can be placed around the stacked spiral inductor coil 102 as well, in the form of vias 606. In some embodiments, as shown in FIG. 6B, a magnetic core can be placed around the stacked spiral inductor coil 102 as well, in the form of a trench 604. The vias 606 and the trench 604 can be fabricated using techniques similar to those described with respect to the fabrication of the magnetic cores 106.

The inventors have discovered that when more than one magnetic core 106 is utilized, the respective magnetic fields of the magnetic cores amplify each other and advantageously provide a stronger aggregate magnetic field. The substrate 100 may also include leads 104A and 104B coupled to ends of the stacked spiral inductor coil 102 to couple the coil to another device or element (e.g., an integrated circuit, a battery, or the like).

As illustrated in FIG. 1B, the stacked spiral inductor coil 102 is formed in and spans the plurality of polymer layers 108. Although five layers are shown in FIG. 1B, the substrate 100 may include between 1 and 6 polymer layers formed atop a substrate base 110. Each magnetic core 106 is formed in a feature extending an uppermost polymer layer 108A to the substrate base 110. In some embodiments, the feature is a via having a high aspect ratio (i.e., via depth greater than via width). In some embodiments, the at least one magnetic core 106 may be formed of a magnetic material such as, for example, one or more of iron (Fe), nickel (Ni), zinc (Zn), nickel-iron (NiFe), nickel-zinc (NiZn), nickel-zinc-copper (NiZnCu), aluminum-nickel-cobalt (AlNiCo), cobalt-tantalum-zirconium (CoTaZr), cobalt-niobium-zirconium (CoNbZr), cobalt-zirconium oxide (CoZrO$_2$), iron-hafnium nitride (FeHfN), cobalt-iron-hafnium oxide (CoFeHfO), or the like.

In some embodiments, the substrate base 110 is composed of a material used in a semiconductor manufacturing process. For example, the substrate base 110 may comprise one or more of silicon (Si), germanium, silicon germanium, doped or undoped polysilicon, doped or undoped silicon, and patterned or non-patterned silicon on insulators (SOI), epoxy mold compound or the like. The substrate base 110 may have various dimensions, such as 150 mm, 200 mm, 300 mm or 450 mm diameters or other dimensions. In addition, the substrate base 110 may include additional layers of materials or may have one or more completed or partially completed structures or devices formed in or on the substrate base 110.

Figure 2:
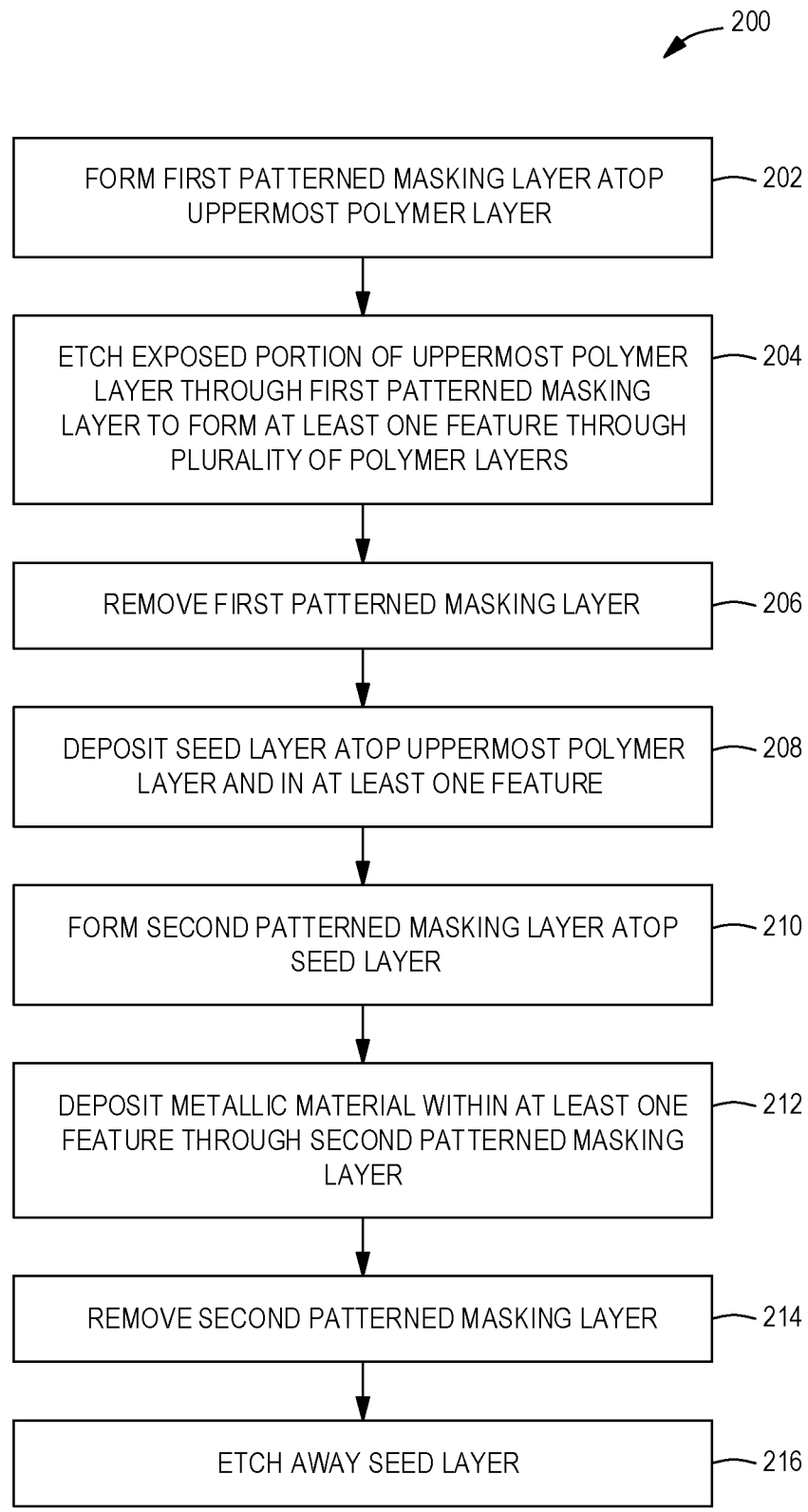
FIG. 2 depicts a flow chart of a method of forming a magnetic core on a substrate in accordance with at least some embodiments of the present disclosure.

FIG. 2 depicts a flow chart of a method 200 for forming a magnetic core on a substrate having a stacked inductor coil in accordance with at least some embodiments of the present disclosure. The method 200 is described below in accordance with the stages of substrate packaging depicted in FIGS. 3A-3H. Each of FIGS. 3A-3H includes a schematic side view for the particular stage of fabrication. The method 200 may be performed in any suitable process chambers configured for the processes described below. Exemplary processing chambers and systems that may be used to perform the inventive methods disclosed herein may include, but are not limited to, various processing systems commercially available from Applied Materials, Inc., of Santa Clara, Calif. Other process chambers, including ones available from other manufacturers, may also be suitably used in connection with the teachings provided herein.

Figure 3A:
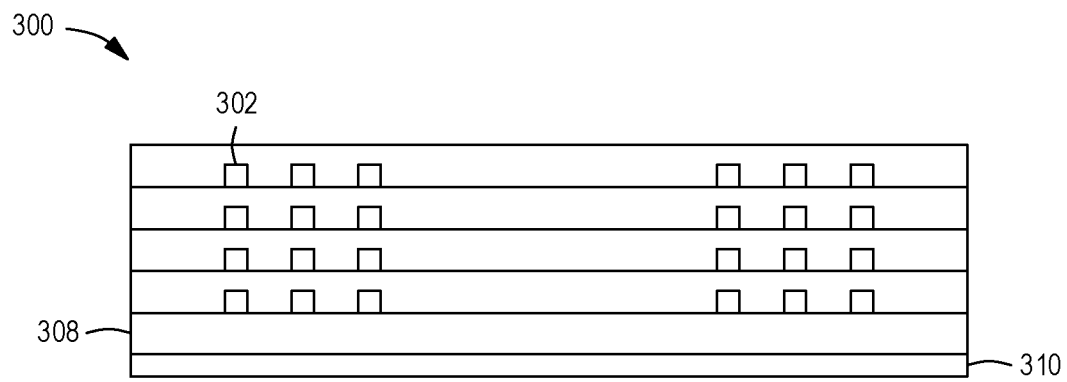
FIGS. 3A-H schematically depict sequential side views of the stages of forming a magnetic core on a substrate in accordance with at least some embodiments of the present disclosure.

The method 200 is performed on a substrate, such as the substrate 300 depicted in FIG. 3A. In some embodiments, the substrate 300 includes a plurality of polymer layers 308 formed atop a substrate base 310 and an inductor coil 302 formed in the plurality of polymer layers 308.

Figure 3B:
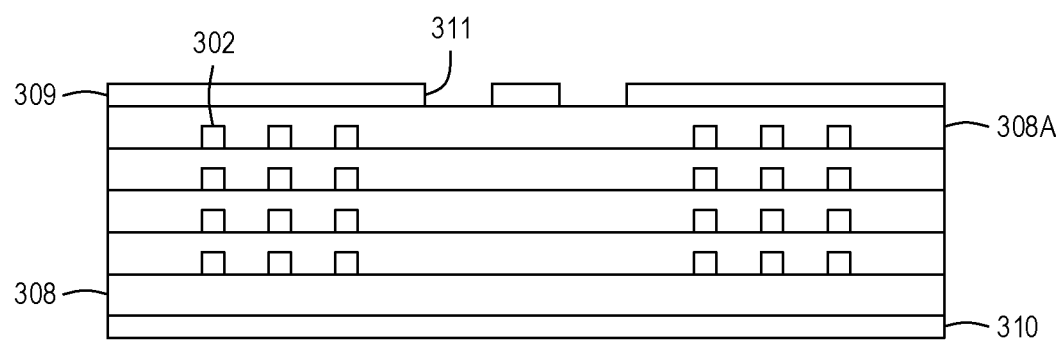
Figure 3C:
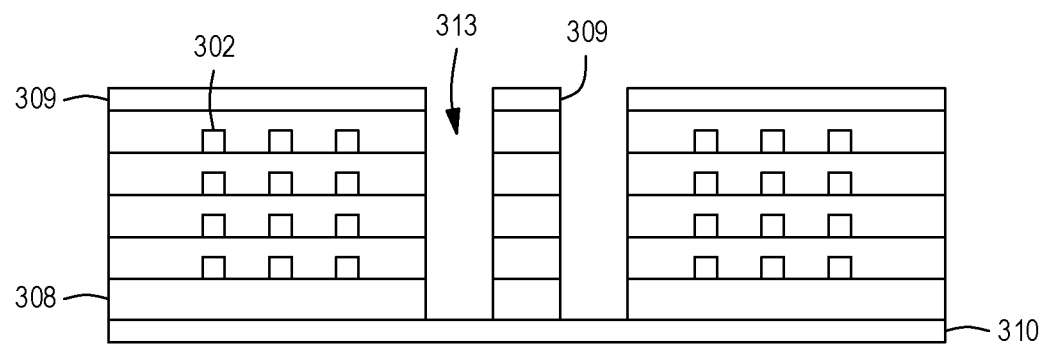

The method generally begins at 202, and as depicted in FIG. 3B, by forming a first patterned masking layer 309 atop an uppermost polymer layer 308A of a plurality of polymer layers 308. In some embodiments, the polymer layers 308 may be one or more of a polybenzoxazole (PBO) layer, a polyimide (PI) layer, a benzocyclobutene (BCB) layer, an epoxy layer, or a photo-sensitive material layer. The first patterned masking layer 309 is configured to facilitate etching at least one feature (e.g., a via) into the plurality of polymer layers (as depicted in FIG. 3C). In some embodiments, the first patterned masking layer 309 is configured to facilitate etching of 4 features. In some embodiments, the first patterned masking layer 309 is further configured to facilitate etching at least one additional feature into the plurality of polymer layers corresponding to the plurality of vias 606 or the trench 604, discussed above with respect to FIGS. 6A and 6B. The first patterned masking layer 309 may be formed according to any process suitable to form a masking layer capable of providing an adequate template for defining a pattern in the underlying layer. In some embodiments, the first patterned masking layer 309 may be formed through an etch process, such as a plasma-based dry etching process. The first patterned masking layer 309 may be any suitable masking material, such as a photoresist. In some embodiments, the first patterned masking layer 309 is provided as a negative photoresist. In some embodiments, the first patterned masking layer 309 is provided as a positive photoresist.

As depicted in FIG. 3B, openings 311 are formed through a portion of the first patterned masking layer 309. Each of the openings 311 includes one or more sidewalls defined by portions of the first patterned masking layer 309 and a bottom defined by an exposed top portion of the uppermost polymer layer 308A. Although only two openings 311 are shown, the first patterned masking layer 309 may include a plurality of openings corresponding to a plurality of features to be formed in the plurality of polymer layers 308 (e.g., vias 313 discussed below).

Next at 204, and as depicted in FIG. 3C, each opening 311 is further deepened to form a feature. In some embodiments, the feature is a via 313. Each via 313 is formed by etching the exposed portion of the uppermost polymer layer 308A through the plurality of polymer layers 308 to a top surface of the substrate base 310. In some embodiments, the etching process may be a plasma-based dry etching process. For example, each of the plurality of polymer layers 308 may be exposed to an etching plasma through the openings 311 of the first patterned masking layer 309. The etching plasma may be formed from any suitable gases used to etch polymers, such as an oxygen-containing gas, for example oxygen (O$_2$) gas. The plasma conditions and etch rate are selected based on the thickness of the polymer layers 308 and the desired critical dimension of the etched feature, for example, the critical dimension of the via 313 (e.g., the width or diameter of the via).

Figure 3D:
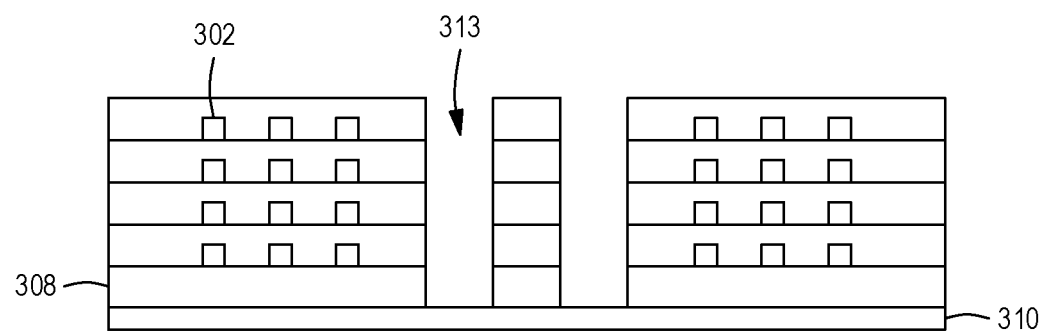

Next at 206, and as depicted in FIG. 3D, remaining portions of the first patterned masking layer 309 are removed. The removal of the first patterned masking layer 309 may be done in any suitable manner, such as via a stripping agent (such as ST120 photoresist removers available from Tokyo Ohka Kogyo (TOK)) or a plasma process (such as oxygen gas ($O_2$) plasma strip).

The removal of the first patterned masking layer 309 leaves behind the vias 313 having a depth equal to the thickness of the plurality of polymer layers 308 and each having a width equal to a desired via width. The sidewalls of each via 313 are vertical or substantially vertical. For example, in some embodiments, the sidewalls of each via 313 may have a vertical angle profile of about 80 to 90 degrees. The bottom of each via 313 is an exposed portion of the substrate base 310.

Figure 3E:
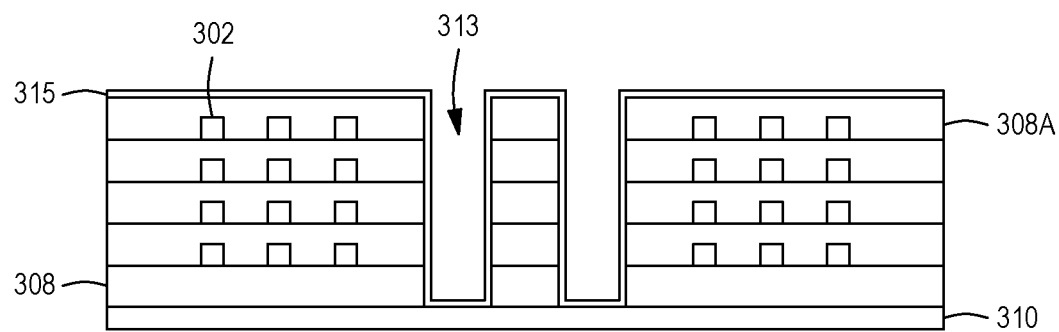

Next at 208, and as depicted in FIG. 3E, a seed layer 315 is deposited atop the uppermost polymer layer 308A and in the vias 313 (and, if present, the additional features to form the plurality of vias 606 or the trench 604). The seed layer 315 may be deposited in any suitable chamber, such as, for example, a physical vapor deposition (PVD) chamber. The seed layer 315 may be formed of any suitable material, such as, for example, copper.

Figure 3F:
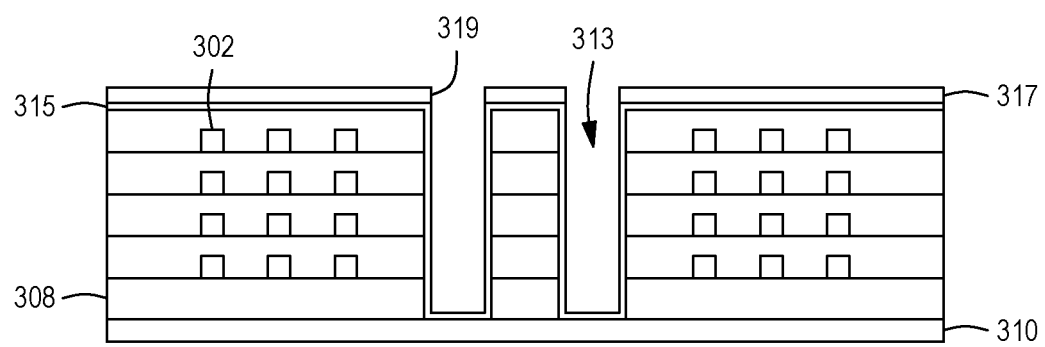

Next at 210, and as depicted in FIG. 3F, a second patterned masking layer 317 is formed atop the seed layer 315. The second patterned masking layer 317 is similar to the first patterned masking layer 309 discussed above and includes openings 319 corresponding to the locations of the vias 313 (and, optionally, the additional features to form the plurality of vias 606 or the trench 604).

Figure 3G:
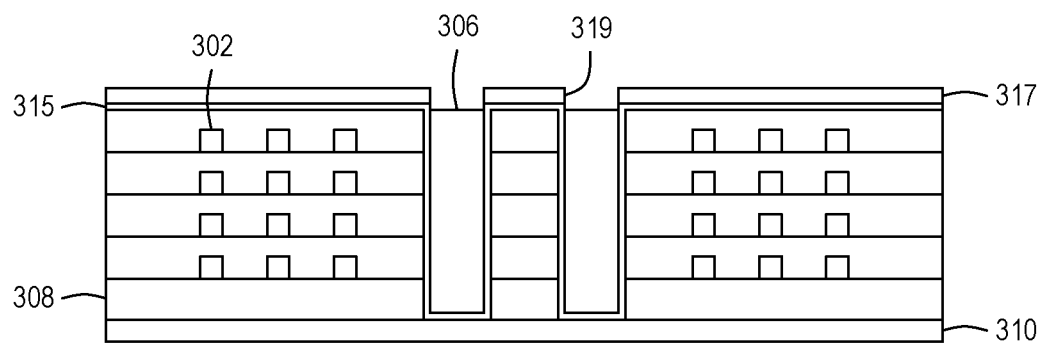

Next at 212, and as depicted in FIG. 3G, a magnetic material is deposited within the vias 313 through the openings 319 to form a magnetic core 306 within each via 313 (e.g., the magnetic material fills the via to form the magnetic core 306). In some embodiments, the magnetic material is also deposited within at least one additional feature to form at least one magnetic core in the form of the plurality of vias 606 or the trench 604. The magnetic material may be deposited via any suitable process. For example, the magnetic material may be deposited via a PVD process. The magnetic material may be any of the materials noted above with respect to magnetic cores 106.

Figure 3H:
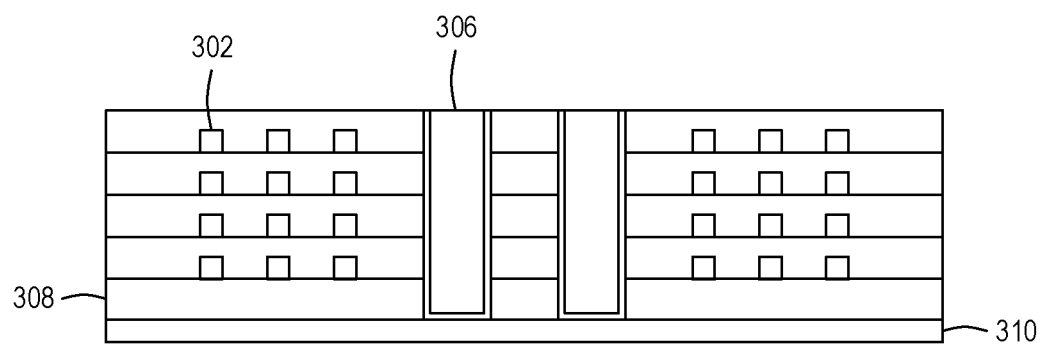

Next at 214, and as depicted in FIG. 3H, remaining portions of the second patterned masking layer 317 are removed in a similar manner as the removal of the first patterned masking layer 309. At 216, and as also depicted in FIG. 3H, exposed portions of the seed layer 315 are removed, leaving behind the substrate having magnetic cores 306 disposed within a central region defined by the stacked inductor coil 302. In some embodiments, the substrate may also include one or more magnetic cores disposed around the stacked inductor coil 302 in the form of the plurality of vias 606 or the trench 604.

Figure 4:
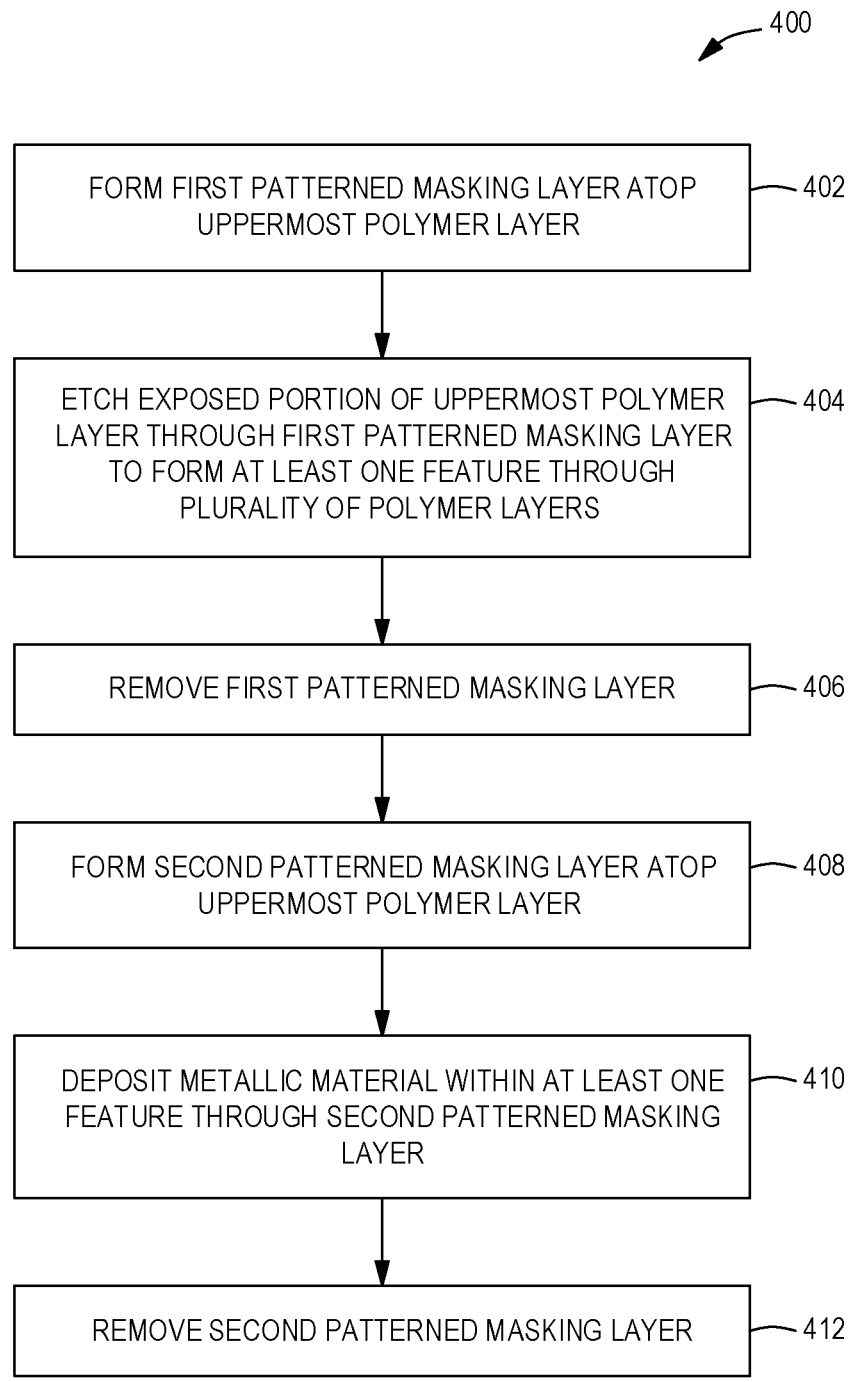
FIG. 4 depicts a flow chart of a method of forming a magnetic core on a substrate in accordance with at least some embodiments of the present disclosure.
Figure 5A:
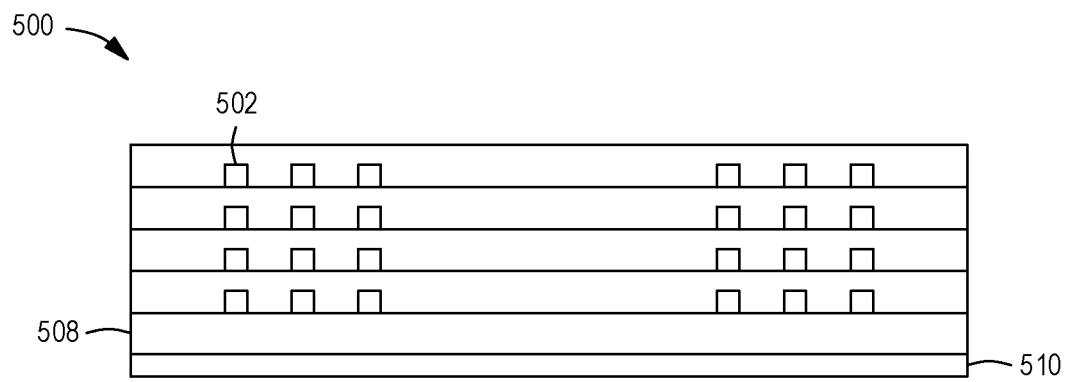
FIGS. 5A-G schematically depict sequential side views of the stages of forming a magnetic core on a substrate in accordance with at least some embodiments of the present disclosure.

FIG. 4 depicts a flow chart of a method 400 for forming a magnetic core on a substrate having a stacked inductor coil in accordance with at least some embodiments of the present disclosure. The method 400 is described below in accordance with the stages of substrate packaging depicted in FIGS. 5A-5G. Each of FIGS. 5A-5G include a schematic side view for the particular stage of fabrication. The method 400 may be performed in any suitable process chambers configured for the processes described below. The method 400 is performed on a substrate, such as the substrate 500, which is similar to the substrate 300 and is depicted in FIG. 5A.

Figure 5B:
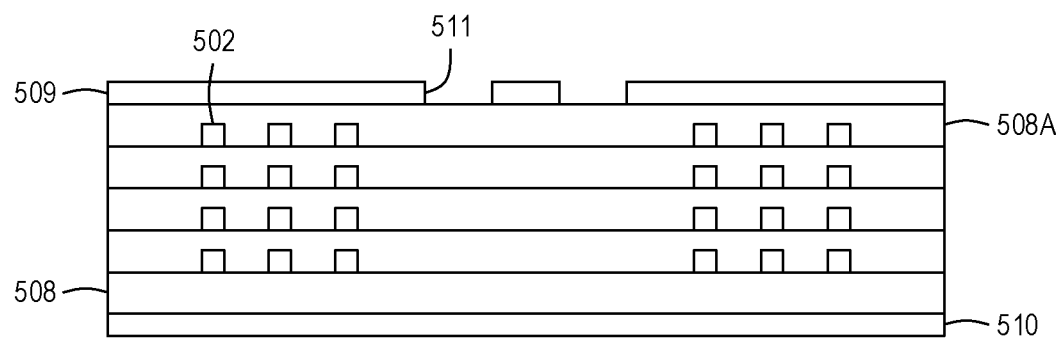
Figure 5C:
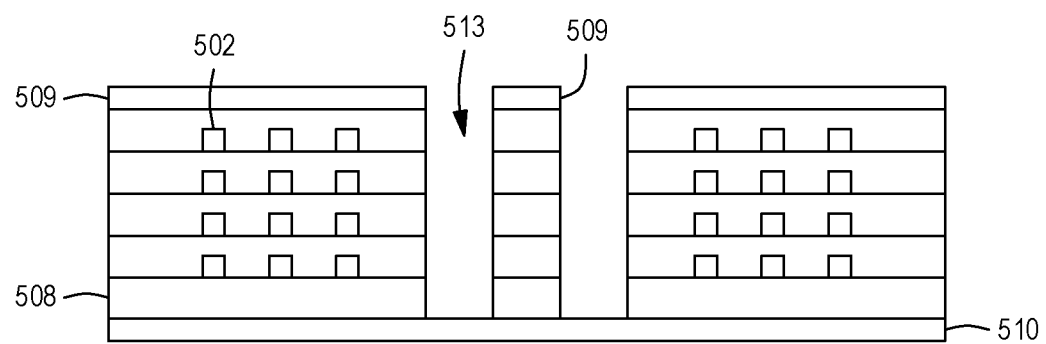

The method 400 generally begins at 402, and as depicted in FIG. 5B, by forming a first patterned masking layer 509 atop an uppermost polymer layer 508A of a plurality of polymer layers 508. The first patterned masking layer 509 is configured to facilitate etching a feature (e.g., a via) into the plurality of polymer layers (as depicted in FIG. 5C). In some embodiments, the first patterned masking layer 509 is further configured to facilitate etching at least one additional feature into the plurality of polymer layers corresponding to the plurality of vias 606 or the trench 604, discussed above with respect to FIGS. 6A and 6B. In some embodiments, the first patterned masking layer 509 is configured to facilitate etching of 4 features. The first patterned masking layer 509 may be formed according to any process suitable to form a masking layer capable of providing an adequate template for defining a pattern in the underlying layer. In some embodiments, the first patterned masking layer 509 may be formed through a lithography process, such as a spin coating process. The first patterned masking layer 509 may be any suitable masking material, such as a photoresist. In some embodiments, the first patterned masking layer 509 is provided as a negative photoresist. In some embodiments, the first patterned masking layer 509 is provided as a positive photoresist.

As depicted in FIG. 5B, openings 511 are formed through a portion of the first patterned masking layer 509. Each of the openings 511 includes one or more sidewalls defined by portions of the first patterned masking layer 509 and a bottom defined by an exposed top portion of the uppermost polymer layer 508A. Although only two openings 511 are shown, the first patterned masking layer 509 may include a plurality of openings corresponding to a plurality of features to be formed in the plurality of polymer layers 508 (e.g., vias 513 discussed below).

Next at 404, and as depicted in FIG. 5C, each opening 511 is further deepened to form a feature. In some embodiments, the feature is a via 513. Each via 513 is formed by etching the exposed portion of the uppermost polymer layer 508A through the plurality of polymer layers 508 to a top surface of the substrate base 510. In some embodiments, the etching process may be a plasma-based dry etching process. For example, each of the plurality of polymer layers 508 may be exposed to an etching plasma through the openings 511 of the first patterned masking layer 509. The etching plasma may be formed from any suitable gases used to etch polymers, such as an oxygen-containing gas, for example oxygen ($O_2$) gas. The plasma conditions and etch rate are selected based on the thickness of the polymer layers 508 and the desired critical dimension of the etched feature, for example, the critical dimension of the via 513 (e.g., the width or diameter of the via).

Figure 5D:
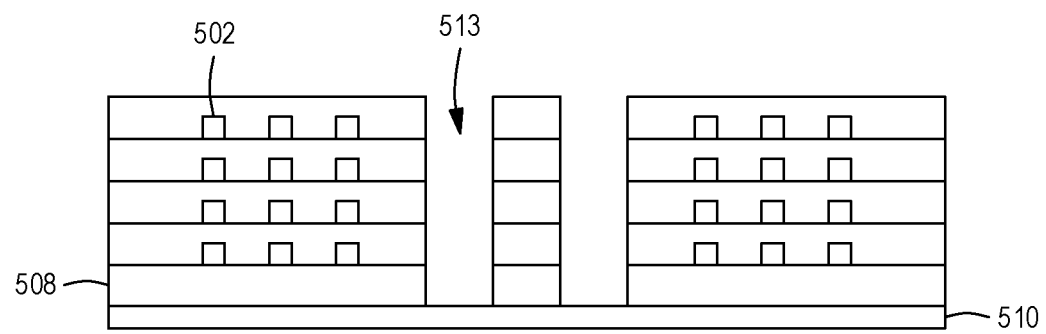

Next at 406, and as depicted in FIG. 5D, remaining portions of the first patterned masking layer 509 are removed. The removal of the first patterned masking layer 509 may be done in any suitable manner, such as via a stripping agent (such as ST120 photoresist removers available from Tokyo Ohka Kogyo (TOK)) or a plasma process (such as oxygen gas ($O_2$) plasma strip).

Figure 5E:
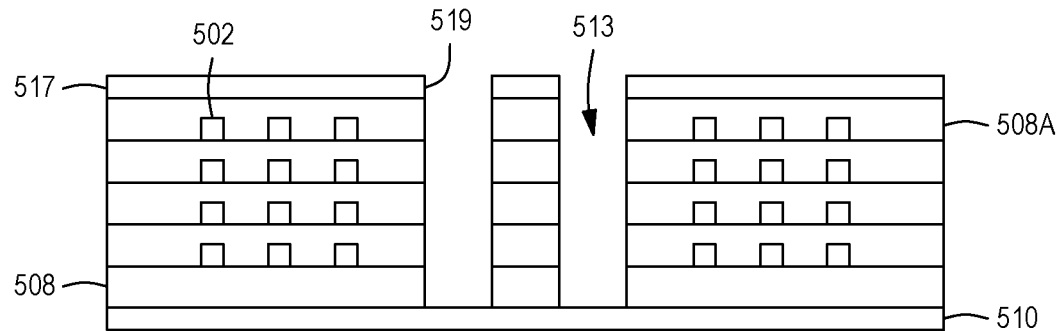

Next at 408, and as depicted in FIG. 5E, a second patterned masking layer 517 is formed atop the uppermost polymer layer 508A. The second patterned masking layer 517 is similar to the first patterned masking layer 509 discussed above and includes openings 519 corresponding to the locations of the vias 513 (and, optionally, the additional features to form the plurality of vias 606 or the trench 604).

Figure 5F:
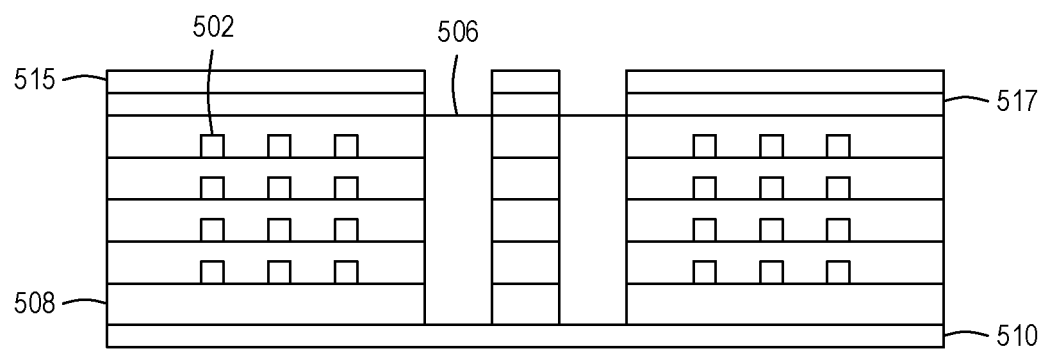

Next at 410, and as depicted in FIG. 5F, a magnetic material 515 is deposited atop the second patterned masking layer 517 and within the vias 513 through the openings 519 to form a magnetic core 506 within each via 513 and, if present, the additional features to form the plurality of vias 606 or the trench 604 (e.g., the magnetic material fills the via to form the magnetic core 506). The magnetic material may be deposited via any suitable process. For example, the magnetic material may be deposited via a PVD process. As noted above, the magnetic material may be any of the materials noted above with respect to magnetic cores 106.

Figure 5G:
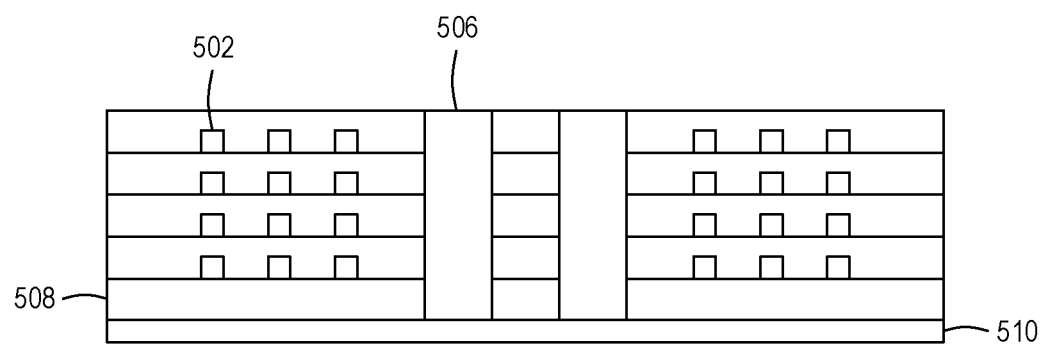

Next at 412, and as depicted in FIG. 5G, remaining portions of the second patterned masking layer 517 are removed in a similar manner as the removal of the first patterned masking layer 509, leaving behind the substrate having magnetic cores 506 disposed within a central region defined by the stacked inductor coil 502. In some embodiments, the substrate may also include one or more magnetic cores disposed around the stacked inductor coil 502 in the form of the plurality of vias 606 or the trench 604.

While the foregoing is directed to some embodiments of the present disclosure, other and further embodiments may be devised without departing from the basic scope of the disclosure.

What is claimed is:

1. A method of forming a magnetic core on a substrate having a stacked inductor coil, comprising:
    etching a plurality of polymer layers to form at least one feature through the plurality of polymer layers, wherein the at least one feature is disposed within a central region of a stacked inductor coil formed on the substrate;
    depositing a magnetic material within the at least one feature; and
    at least one of:
        wherein depositing the magnetic material comprises:
            depositing a seed layer atop an uppermost polymer layer and in the at least one feature;
            forming a second patterned masking layer atop the seed layer;
            depositing the magnetic material within the at least one feature through the second patterned masking layer;
            removing the second patterned masking layer; and
            etching the seed layer, or
        etching the plurality of polymer layers to form at least one additional feature through the plurality of polymer layers, wherein the at least one additional feature is a trench disposed around the stacked inductor coil or a plurality of vias disposed around the stacked inductor coil; and
        depositing the magnetic material within the at least one additional feature.

2. The method of claim 1, wherein etching the plurality of polymer layers comprises:
    forming a first patterned masking layer atop the uppermost polymer layer of a plurality of polymer layers;
    etching an exposed portion of the uppermost polymer layer through the first patterned masking layer to form the at least one feature through the plurality of polymer layers; and
    removing the first patterned masking layer.

3. The method of claim 2, wherein the exposed portion of the uppermost polymer layer is etched with a plasma-based dry etching process.

4. The method of claim 1, wherein the seed layer comprises copper.

5. The method of claim 1, wherein the at least one feature is a high aspect ratio via.

6. The method of claim 1, wherein the magnetic material is deposited via a physical vapor deposition (PVD) process.

7. The method of claim 1, wherein the magnetic material comprises one or more of iron (Fe), nickel (Ni), zinc (Zn), nickel-iron (NiFe), nickel-zinc (NiZn), nickel-zinc-copper (NiZnCu), aluminum-nickel-cobalt (AlNiCo), cobalt-tantalum-zirconium (CoTaZr), cobalt-niobium-zirconium (CoNbZr), cobalt-zirconium oxide ($CoZrO_2$), iron-hafnium nitride (FeHfN), or cobalt-iron-hafnium oxide (CoFeHfO).

8. The method of claim 1, wherein the at least one feature includes a plurality of features.

9. The method of claim 1, wherein the stacked inductor coil is a stacked spiral inductor coil, and further comprising:
    forming the stacked spiral inductor coil atop the substrate, wherein the stacked spiral inductor coil is disposed within the plurality of polymer layers;
    forming a first photoresist atop the uppermost polymer layer prior to etching the plurality of polymer layers and depositing the seed layer;
    etching a plurality of exposed portions of the uppermost polymer layer through the first photoresist to form one or more vias through the plurality of polymer layers, wherein the one or more vies are the at least one feature;
    removing the first photoresist;
    forming a second photoresist atop the seed layer, wherein the second photoresist is the second patterned masking layer;
    depositing the magnetic material within the one or more vias through the second photoresist; and
    removing the second photoresist.

10. The method of claim 9, wherein each of the one or n ore vies has a high aspect ratio.

11. The method of claim 9, wherein the magnetic material is deposited via a physical vapor deposition (PVD) process.

12. The method of claim 9, wherein the magnetic material comprises one or more of iron (Fe), nickel (Ni), zinc (Zn), nickel-iron (NiFe), nickel-zinc (NiZn), nickel-zinc-copper (NiZnCu), aluminum-nickel-cobalt (AlNiCo), cobalt-tantalum-zirconium (CoTaZr), cobalt-niobium-zirconium (CoNbZr), cobalt-zirconium oxide ($CoZrO_2$), iron-hafnium nitride (FeHfN), or cobalt-iron-hafnium oxide (CoFeHfO).

13. The method of claim 9, wherein the one or more vies is a plurality of vias.

14. The method of claim 9, wherein the plurality of exposed portions of the uppermost polymer layer are etched with a plasma-based dry etching process.

15. The method of claim 9, further comprising:
    etching the plurality of polymer layers to form at least one additional feature through the plurality of polymer layers, wherein the at least one additional feature is a trench disposed around the stacked spiral inductor coil or a plurality of vias disposed around the stacked spiral inductor coil.

16. The method of claim 15, further comprising depositing a magnetic material within the at least one additional feature.

17. The method of claim 9, wherein the second photoresist is similar to the first photoresist.

* * * * *

UNITED STATES PATENT AND TRADEMARK OFFICE
CERTIFICATE OF CORRECTION

PATENT NO. : 11,373,803 B2
APPLICATION NO. : 16/056847
DATED : June 28, 2022
INVENTOR(S) : Suo et al.

It is certified that error appears in the above-identified patent and that said Letters Patent is hereby corrected as shown below:

In the Claims

In Claim 9, Column 8, Line 23, delete "lavers" and insert -- layers --

In Claim 9, Column 8, Line 28, delete "vies" and insert -- vias --

In Claim 9, Column 8, Line 31, delete "layer," and insert -- layer --

In Claim 10, Column 8, Line 37-38, delete "one or n ore vies" and insert -- one or more vias --

In Claim 13, Column 8, Line 49, delete "vies" and insert -- vias --

Signed and Sealed this
Sixteenth Day of August, 2022

Katherine Kelly Vidal
*Director of the United States Patent and Trademark Office*